United States Patent [19]

Tsugaru et al.

[11] Patent Number: 4,782,251

[45] Date of Patent: Nov. 1, 1988

[54] LEVEL CONVERSION CIRCUIT

[75] Inventors: Kazunori Tsugaru; Yasuhiro Sugimoto, both of Yokohama, Japan

[73] Assignee: Kabushiki Kaisha Toshiba, Kawasaki, Japan

[21] Appl. No.: 848

[22] Filed: Jan. 6, 1987

[30] Foreign Application Priority Data

Jan. 9, 1986 [JP] Japan .................................. 61-1258

[51] Int. Cl.⁴ .................. H03K 19/092; H03K 19/094
[52] U.S. Cl. .................................... 307/475; 307/264; 307/451
[58] Field of Search ............... 307/264, 451, 455, 467, 307/469, 475

[56] References Cited

U.S. PATENT DOCUMENTS 4,437,171  3/1984  Hudson et al. .
4,453,095  6/1984  Wrathall .
4,645,951  2/1987  Uragami .............................. 307/475

OTHER PUBLICATIONS

Patent Abstracts of Japan, vol. 8, No. 167 (E-258) [1604], Aug. 2, 1984; & JP-A-59 64916 (Thoshiba K.K.) 13-04-1984, *whole document*.

Primary Examiner—John Zazworsky
Attorney, Agent, or Firm—Oblon, Fisher, Spivak, McClelland & Maier

[57] ABSTRACT

Level conversion circuit for converting CMOS logic level signals to ECL logic level signals. The level conversion circuit includes: a level shift circuit which receives as input a CMOS logic level signal and a CMOS logic level signal of opposite logic level to the first-mentioned CMOS logic level signal, and which supplies a base potential that effects operation of a bipolar transistor in the unsaturated region and a base potential at which the bipolar transistor becomes non-conducting; a differential amplifier circuit inserted between a high-potential voltage source and a low-potential voltage source and that selects the path of current flowing from the high-potential voltage source to the low-potential voltage source by controlling bipolar transistors whose emitter terminals are mutually connected and whose conduction is controlled by said base potentials; and a bipolar transistor that is conduction controlled by one of the collector potentials of said bipolar transistors and that outputs an ECL logic level signal from its emitter terminal.

4 Claims, 1 Drawing Sheet

LEVEL CONVERSION CIRCUIT

BACKGROUND OF THE INVENTION

1. Field of the Invention

The present invention relates to a level conversion circuit, and more particularly to a level conversion circuit for converting a CMOS (Complementary Metal Oxide Semiconductor) level signal to an ECL (Emitter-Coupled Logic) level signal.

2. Description of the Prior Art

Recently, so-called Bi-CMOS circuits have become popular in semiconductor circuit fields. The Bi-CMOS circuits have a combined structure of bipolar device circuits and CMOS device circuits commonly formed on one single chip Bipolar circuits such as ECL LSIs (Large Scale Integrated circuits) typically provide fast circuit speeds, reduced delay per unit load, and have historical been the predominate technology applied in ICs (Integrated Circuits). CMOS circuits provide high noise immunity, high input impedance, and low power consumptions, and have rapidly gained acceptance in the industry. Thus Bi-CMOS circuits may have the features of both the bipolar circuits and the CMOS circuits.

To use ECL device circuits together with CMOS device circuits, the input-output levels of both circuits must be matched and in particular, an interface circuit for converting a CMOS logic level (high level; power source potential, for example, 5.0 volts, low level; ground potential, i.e., 0 volts) to an ECL logic level (high level; for example, −0.7 volts, low level; for example, −2.5 volts) is necessary.

One previously known circuit converting the CMOS logic level to the ECL logic level comprises a pair of push-pull bipolar transistors, e.g., NPN transistors. The upper NPN transistor has a collector terminal connected to a first potential source and a source terminal of a MOS device, e.g., P-channel MOS transistor (referred as PMOS transistor hereafter), an emitter terminal connected to an output terminal and the collector terminal of the lower bipolar transistor, and a base terminal connected to an input terminal and the gate terminals of the PMOS transistor and an N-channel MOS transistor (referred as NMOS transistor hereafter) which is connected to the PMOS transistor so that they constitute a CMOS structure. The emitter terminal of the lower NPN transistor is connected to a second potential source and the source terminal of the NMOS transistor, and a base terminal connected to the drain terminals of the PMOS transistor and the NMOS transistor. However, this circuit has a low impedance at the input terminal since the input terminal is connected to the base terminal of the upper NPN transistor, and as the output of the circuit switches from low to high, the lower NPN transistor is slow to turn off causing a slow transition to the high output.

Thus, what is needed is an IC combining CMOS and bipolar technology having a high input impedance, improved switching characteristics, low power consumption, and high noise immunity.

SUMMARY OF THE INVENTION

Accordingly, an object of the present invention is to provide an improved level conversion circuit for converting CMOS level signals to ECL level signals.

Another object of the present invention is to provide a level conversion circuit having improved output signal switching characteristics.

A further object of the present invention is to provide a level conversion circuit having a high input impedance.

Still another object of the present invention is to provide a level conversion circuit having low power consumption.

In order to achieve the above objects, the level conversion circuit according to the present invention includes a level shift circuit which receives as an input a CMOS logic level signal and a CMOS logic level signal of opposite logic level to the first-mentioned CMOS logic level signal, and which supplies a base potential that effects operation of a bipolar transistor in the unsaturated region and a base potential at which the bipolar transistor becomes non-conducting, a differential amplifier circuit inserted between a high-potential voltage source and a low-potential voltage source and that selects the path of current flowing from the high-potential voltage source to the low-potential voltage source under the control of bipolar transistors whose emitter terminals are mutually connected and whose conduction is controlled by said base potentials, and a bipolar transistor that is conduction controlled by one of the collector potentials of said bipolar transistors and that outputs an ECL logic level signal from its emitter terminal.

DESCRIPTION OF THE PREFERRED EMBODIMENT

The present invention will now be described in detail with reference to the accompanying drawings, namely, FIGS. 1 and 2.

Figure 1:
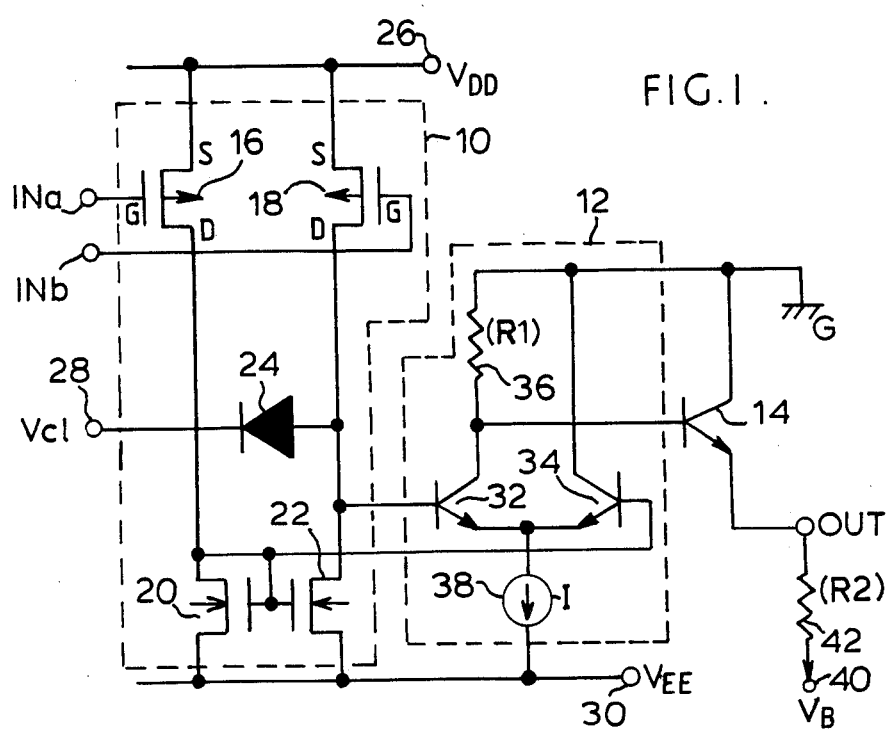
FIG. 1 is a schematic circuit diagram of a level conversion circuit according to the present invention.

Referring now to FIG. 1, an embodiment of the level conversion circuit according to the present invention will be described. FIG. 1 is a circuit diagram showing an embodiment of level conversion circuit according to the present invention. The level conversion circuit includes a level shift circuit 10 the output of which shifts between two levels in response to an input CMOS level signal, a differential circuit 12 having two current paths which selectively become conductive in response to the output level of the level shift circuit 10, and a bipolar transistor 14 which has its conductivity controlled by the differential circuit 12 and outputs an ECL level signal corresponding to the input CMOS level signal.

The level shift circuit 10 is provided with first and second PMOS transistors 16 and 18, first and a second NMOS transistors 20 and 22, and a PN junction diode 24. The first PMOS transistor 16 has a gate terminal connected to a non-inverse input terminal INa, a source terminal connected to a first potential source 26 which supplies a first potential $V_{DD}$ of, e.g., 5 volts, and a drain terminal connected to a drain terminal of the first NMOS transistor 20. The second PMOS transistor 18 has a gate terminal connected to an inverse input terminal INb, a source terminal connected to the $V_{DD}$ potential source 26, and a drain terminal connected to a drain terminal of the second NMOS transistor 22. The anode terminal of PN junction diode 74 is connected to the drain terminal of the second PMOS transistor 18 and its cathode terminal is connected to a second potential source 28 which supplies a second potential Vcl of, e.g., —1.5 volts. The respective gate terminals of the first and second NMOS transistors 20 and 22 are connected together and also connected to the drain terminal of the first NMOS transistor 20, and their respective source terminals are connected to a third potential source 30 which supplies a third potential $V_{EE}$ of, e.g. —3.0 volts.

The differential circuit 12 is provided with first and second NPN transistors 32 and 34, a resistor 36 with a resistance R1, and a current source 38. The first NPN transistor 32 has a base terminal connected to the drain terminal of the second PMOS transistor 18, a collector terminal connected to a ground terminal G through the resistor 36, and an emitter terminal connected to the $V_{EE}$ potential source 30 through the current source 38. The second NPN transistor 34 has a base terminal connected to the connection node of the gate terminals of the first and second NMOS transistors 20 and 22 and the drain terminal of the first PMOS transistor 16, a collector terminal connected to the ground terminal G, and an emitter terminal connected to the Vee potential source 30 through the current source 38 together with the base terminal of the first NPN transistor 32.

The bipolar transistor 14 is a third NPN transistor and the third NPN transistor 14 has a base terminal connected to the collector terminal of the first NPN transistor 32, a collector terminal connected to the ground terminal G, and an emitter terminal connected to the output terminal OUT. The output terminal OUT is used to be connected to a fourth potential source 40 which supplies a fourth potential $V_B$ of, e.g., —2.0 volts through a load circuit 42, i.e., an ECL device circuit. In FIG. 1, the load circuit 42, i.e., an ECL device circuit is shown as a form of resistor with a resistance R2 of about 50 ohms.

The operation of the embodiment of the level conversion circuit according to the present invention will now be described.

CMOS logic signals are applied across the input terminals INa and INb of the level conversion circuit. First, here will be described a case that a high level CMOS logic signal is applied to the input terminals INa and INb. Hereafter, it is assumed that when the high level CMOS logic signal is applied to the input terminals INa and INb, the high level 5.0 volts of CMOS logic signals is applied to the non-inverse input terminal INa, while the low level 0 volts of CMOS logic signals which is the inverse level of the high level of CMOS logic signals is applied to the inverse input terminal INb.

The first PMOS transistor 16 is then rendered non-conductive. In this state, the first NMOS transistor 20 acts as a relatively small resistance, since its gate and drain terminals are connected together. So that the potential on the drain terminal of the first NMOS transistor 20 coincides with the potential of the $V_{EE}$ potential source 30, i.e., —3.0 volts. On the other hand, the second PMOS transistor 18 is rendered conductive. So that, a current flows from the $V_{DD}$ potential source 26 to the Vcl potential source 28 through the second PMOS transistor 18 and the diode 24. As a result, the anode potential of the diode 24 increases to a potential which is higher than the Vcl potential, i.e., —1.5 volts by the forward voltage of pn junction diodes, e.g., 0.7 volts. As a result, the anode potential of the diode 24 becomes to about —0.8 volts (i.e., —1.5 volts+0.7 volts).

The first NPN transistor 32 of the differential circuit 12 is therefore supplied at its base terminal with the potential —0.8 volts on the anode of the diode 24, so that the first NPN transistor 32 is rendered conductive but operates in the unsaturated region. The second NPN transistor 34 of the differential circuit 12 is supplied at its base terminal with the potential —3.0 volts on the drain terminal of the first NMOS transistor 20, so that the second NPN transistor 34 is rendered non-conductive. As a result, the current I of the current source 38 flows through a current path including the resistor 36 and the first NPN transistor 32, from the ground terminal G to the $V_{EE}$ potential source 30. If the resistance R1 of the resistor 36 is set to 300 ohms and the current I of the current source 38 is set to about 3 mA, the collector potential of the first NPN transistor 32 is then set to about —0.9 volts (i.e., 300 ohms×3 mA). The collector potential —0.9 volts is applied to the base terminal of the third NPN transistor 14. Therefore, the third NPN transistor 14 becomes conductive and a current flows therethrough from the ground terminal G to the load circuit 42 connected to the output terminal OUT. As a result, the emitter potential of their NPN transistor 14, i.e., the level of the output terminal OUT becomes lower than the base potential of the third NPN transistor 14, which is set to the collector potential —0.9 volts as mentioned above, by the forward base to emitter voltage drop usually 0.9 volts of the third NPN transistor 14. So that the potential level of about —1.8 volts is obtained on the output terminal OUT.

Consequently, when high level CMOS logic signals are applied between the input terminals INa and INb, low level ECL logic signals are obtained on the output terminal OUT.

Next, here will be described another case that a low level CMOS logic signal is applied to the input terminals INa and INb. The first PMOS transistor 16 then has applied to its gate terminal the low level 0 volts of CMOS logic signals and is rendered conductive. In this state, the first NMOS transistor 20 also is rendered conductive. Here, the first PMOS transistor 16 and the first NMOS transistor 20 are set so that they have respective resistances related to a ratio of 5:3 with respect to each other in the conductive state. The ratio is set in corresponding to the ratio of the absolute values of the $V_{DD}$ potential, i.e., 5.0 volts and the $V_{EE}$ potential, i.e., 3.0 volts. According to the resistance ratio, the potential on the connection node between the first PMOS and NMOS transistors 16 and 20, i.e., the potential on their drain terminals becomes 0 volts.

On the other hand, the second PMOS transistor 18 has applied to its gate terminal the high level 5.0 volts of CMOS logic signals and is rendered non-conductive. However, the second NMOS transistor 22 is rendered conductive, since its gate is applied the potential 0 volts on the drain terminals of the first PMOS and NMOS transistors 18 and 20. Therefore, the drain potential of the second NMOS transistor 22 becomes —3.0 volts.

The first NPN transistor 32 of the differential circuit 12 therefore has supplied to its base terminal the potential —3.0 volts on the drain terminal of the second NMOS transistor 22, so that the first NPN transistor 32 is rendered non-conductive. The second NPN transistor 34 of the differential circuit 12 has supplied to its base terminal the potential 0 volts on the drain terminals of the first PMOS and NMOS transistors 16 and 20, so that the second NPN transistor 34 is rendered conductive. The current I of the current source 38 then flows through another current path including the second NPN transistor 34, from the ground terminal G to the $V_{EE}$ potential source 30. In this condition, the base terminal of the third NPN transistor 14 is supplied with the potential 0 volts on the ground terminal G so that the third NPN transistor 14 is rendered non-conductive. As a result, the emitter potential of third NPN transistor 14, i.e., the level of the output terminal OUT becomes lower than the base potential of the third NPN transistor 14, which is set to the collector potential 0 volts as mentioned above, by the forward base to emitter voltage drop 0.9 volts of the third NPN transistor 14. So that the potential level of about −0.9 volts is obtained on the output terminal OUT.

Consequently, when low level CMOS logic signals are applied between the input terminals INa and INb, high level ECL logic signals are obtained on the output terminal OUT.

Figure 2:
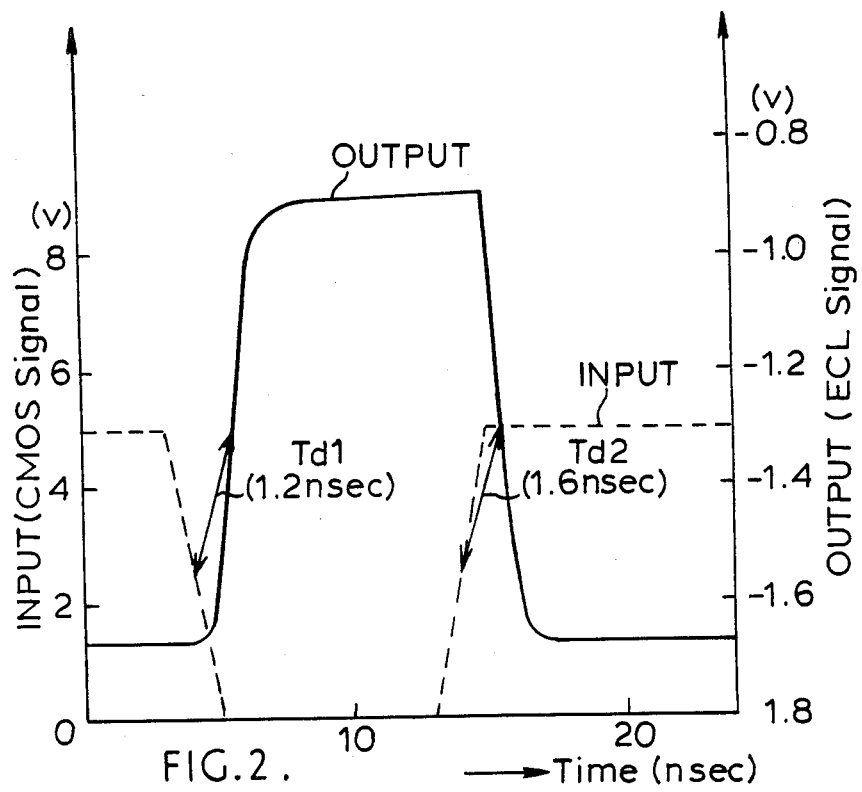
FIG. 2 is a level diagram showing level conversion operation of the circuit shown in FIG. 1.

FIG. 2 shows the level conversion characteristics of the embodiment. In FIG. 2, the broken line is a simulation graph of the input CMOS logic level signal and the solid line is a simulation graph of the output ECL logic level signal. As seen from FIG. 2, the output ECL logic level signal has a delay time Td1 of about 1.2 nsec. (nano second) when the input CMOS logic level signal changes from the high level state to the low level state and a delay time Td2 of about 1.6 nsec. when the input CMOS logic level signal changes from the low level state to the high level state. These delay times are measured by time durations between the times the respective signals achieve 50% of their amplitudes. On the other hand, in the example of conventional level conversion circuits described above, the delay times Td1 and Td2 were 1.7 nsec. and 2.3 nsec. respectively.

From the foregoing detailed description, it can thus be seen that the present invention provides a level conversion circuit to perform the level conversion of the CMOS logic level signals into the ECL logic level signals. The level conversion circuit of the present invention has the features of reduced circuit speed, low power consumption and high input impedance.

While there has been illustrated and described what is presently a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed for carrying out this invention, but that the invention will include all embodiments following within the scope the appended claims.

What is claimed is:

1. A level conversion circuit for converting a CMOS logic level signal to an ECL logic level signal comprising:

means for receiving the CMOS logical signal;
means connected to the signal receiving means for producing a control signal which is shiftable between two levels in response to the CMOS logic signal;
a high potential source;
a low potential source;
a ground potential source;
means for providing a current path between the ground potential source and the low potential source, the current path providing means including first and second bipolar transistors which are switched either into an unsaturated conduction state or a non-conducting state in dependence on said control signal so that the conductance or the non-conductance of the current path is controlled in response to the control signal;
an output terminal; and
a bipolar transistor means connected between the ground potential source and the output terminal for outputting the ECL logic signal in response to the conductance or the non-conductance of the current path.

2. The level conversion circuit of claim 1, further comprising an intermediate potential source, and wherein the CMOS logic receiving means includes a non-inverse side and an inverse side and wherein the control signal producing means includes first and second MOS transistors of one conductivity, third and fourth MOS transistors of another conductivity and a pn junction diode, the first MOS transistor being connected to said non-inverse side and said second MOS transistor connected to said inverse side of the signal receiving means, the third and fourth MOS transistors having respective gate terminals connected to each other and to the drain terminal of third MOS transistor and respectively connected between the high potential source and the low potential source through the first and second MOS transistor, and the diode connected between said intermediate potential source and the drain of the fourth MOS transistor.

3. The level conversion circuit of claim 2, wherein the first and second bipolar transistors of said current path providing means are interconnected as a differential circuit.

4. The level conversion circuit of claim 3, wherein the differential circuit includes a resistor and a current source, the first bipolar transistor having a collector connected to the ground potential source through the resistor, an emitter connected to the low potential source through the current source and a base connected to the drain terminal of the fourth MOS transistor, and the second bipolar transistor having a collector connected to the ground potential source, an emitter connected to the low potential source through the current source together with the emitter of the first bipolar transistor and a base connected to the drain terminal of the third MOS transistor, wherein the bipolar transistor means includes a third bipolar transistor having a collector terminal connected to the ground potential source, an emitter terminal connected to the output terminal and a base terminal connected to the collector terminal of the first bipolar transistor.

* * * * *